US 6,630,390 B2

(12) United States Patent
Andideh et al.

(10) Patent No.: US 6,630,390 B2
(45) Date of Patent: Oct. 7, 2003

(54) METHOD OF FORMING A SEMICONDUCTOR DEVICE USING A CARBON DOPED OXIDE LAYER TO CONTROL THE CHEMICAL MECHANICAL POLISHING OF A DIELECTRIC LAYER

(75) Inventors: Ebrahim Andideh, Portland, OR (US); Clark Cummins, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/354,361

(22) Filed: Jan. 29, 2003

(65) Prior Publication Data

US 2003/0139051 A1 Jul. 24, 2003

Related U.S. Application Data

(62) Division of application No. 09/996,215, filed on Dec. 20, 2001, now Pat. No. 6,548,399.

(51) Int. Cl.⁷ .............................................. H01L 21/76
(52) U.S. Cl. ...................... 438/427; 438/435; 438/637; 438/692
(58) Field of Search ........................... 438/424, 427, 438/435, 626, 633, 637, 692

(56) References Cited

U.S. PATENT DOCUMENTS

| 5,688,720 A | 11/1997 | Hayashi |
| 5,719,085 A | 2/1998 | Moon et al. |
| 5,721,172 A | 2/1998 | Jang et al. |
| 5,741,740 A | * 4/1998 | Jang et al. .............. 438/435 |
| 5,872,043 A | 2/1999 | Chen |
| 6,030,892 A | 2/2000 | Wu et al. |
| 6,051,496 A | 4/2000 | Jang |
| 6,127,259 A | 10/2000 | Shields et al. |
| 6,207,533 B1 | * 3/2001 | Gao .............. 438/424 |
| 6,348,421 B1 | 2/2002 | Shu et al. |
| 6,383,935 B1 | 5/2002 | Lin et al. |
| 6,384,482 B1 | 5/2002 | Yang et al. |
| 2002/0031985 A1 | 3/2002 | Wang et al. |
| 2002/0068436 A1 | 6/2002 | Dakshina-Murthy et al. |

* cited by examiner

*Primary Examiner*—Carl Whitehead, Jr.
*Assistant Examiner*—David S Blum
(74) *Attorney, Agent, or Firm*—Mark V. Seeley

(57) ABSTRACT

A method for making a semiconductor device is described. That method comprises forming a carbon doped oxide containing layer and a dielectric layer on a substrate, such that at least part of the dielectric layer is located above at least part of the carbon doped oxide containing layer. A chemical mechanical polishing process is then applied to remove the part of the dielectric layer that is located above the part of the carbon doped oxide containing layer, such that it removes the dielectric layer at a significantly faster rate than it can remove the carbon doped oxide containing layer.

2 Claims, 3 Drawing Sheets

METHOD OF FORMING A SEMICONDUCTOR DEVICE USING A CARBON DOPED OXIDE LAYER TO CONTROL THE CHEMICAL MECHANICAL POLISHING OF A DIELECTRIC LAYER

This is a Divisional application of Ser. No.: 09/996,215 filed Dec. 20, 2001, which is now U.S. Pat. No. 6,548,399.

FIELD OF THE INVENTION

The present invention relates to methods for making semiconductor devices, in particular, those that apply a chemical mechanical polishing process to planarize a dielectric layer.

BACKGROUND OF THE INVENTION

When making semiconductor devices, dielectric layers are used to separate various components (e.g., transistors and capacitors) from each other or from conductive layers formed on top of them. Such dielectric layers may also separate conductive layers (or other structures or elements) from each other. When initially formed, a dielectric layer may assume a shape that conforms to the underlying topography. If that layer is formed on a surface that has raised and recessed features, then it can likewise have elevated and recessed sections.

It may be desirable to planarize such a dielectric layer prior to forming subsequent layers on its surface. A chemical mechanical polishing ("CMP") process may be used to planarize such a layer. To achieve that result, it may be necessary to control such a CMP process to cause it to remove more material where the dielectric layer is elevated, and less material where the dielectric layer is recessed. By removing different amounts of material from different sections of the dielectric layer, a CMP process can planarize a dielectric layer, which had an irregular topography when deposited.

Some processes require a dielectric layer to be planarized, not to produce a substantially flat layer that covers an entire wafer, but instead to generate a structure in which a dielectric layer fills a trench. To make such a structure, a trench is formed within a substrate, or between raised members, followed by depositing a dielectric material over the resulting structure. A CMP process may then be used to remove the deposited material, except where it fills the trench. Measures often must be taken to prevent that process from removing too much of the dielectric layer from the trench, or from removing portions of other materials that should be retained.

To control the CMP process, when used in such a method, it may be necessary to limit its duration, or to form a polish stop layer below the dielectric material. A silicon nitride layer may serve as such a polish stop layer when, for example, forming a shallow trench isolation region in a substrate, which will separate devices to be formed on adjacent active regions. Such a polish stop layer prevents a CMP process from removing an excessive amount of the dielectric material (e.g., silicon dioxide) from the trench, while protecting other portions of the substrate.

Current methods for controlling the CMP process, when used to planarize a dielectric layer, may not be especially robust. In particular, using silicon nitride as a polish stop layer can be problematic, if the polish rate selectivity for the dielectric layer to the silicon nitride layer is about 4:1 or less. Because, in general, CMP processes are inherently nonuniform, such a polish rate selectivity may require forming a thicker silicon nitride layer than would otherwise be desired. A thicker layer may be necessary to prevent the CMP process from having to break through parts of it to ensure the complete removal of the dielectric layer that is deposited on the silicon nitride layer's surface. Integrating a thicker silicon nitride layer into the process may decrease throughput, as it takes longer to deposit and etch a thicker layer. In addition, forming a thicker layer will increase the aspect ratio (i.e., the ratio of height to width) of the trench, which could make it more difficult to fill the trench with the dielectric layer.

Accordingly, there is a need for an improved method for controlling a CMP process that is used to remove portions of a dielectric material, when making a semiconductor device. There is a need for such a method that provides an improved polish stop layer for terminating a CMP process after it has removed the dielectric material from the polish stop layer's surface. There is also a need for such a method that enables a CMP process to effectively planarize a dielectric layer, which has an uneven topography when initially formed. The process of the present invention provides such a method.

DETAILED DESCRIPTION OF THE PRESENT INVENTION

An improved method for making a semiconductor device is described. That method comprises forming a carbon doped oxide containing layer and a dielectric layer on a substrate, such that at least part of the dielectric layer is located above at least part of the carbon doped oxide containing layer. A chemical mechanical polishing process is then applied to remove the part of the dielectric layer that is located above part of the carbon doped oxide containing layer. In this method, the chemical mechanical polishing process removes the dielectric layer at a significantly faster rate than it can remove the carbon doped oxide containing layer.

The method of the present invention can be used either in processes that form the dielectric layer on the carbon doped oxide containing layer, or in processes that form the carbon doped oxide containing layer on the dielectric layer. In either case, the part of the carbon doped oxide containing layer, above which at least part of the dielectric layer is located, may serve as a polish stop layer, when the chemical mechanical polishing process removes part of the dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

FIGS. 1a–1e represent cross-sections of structures that may result after certain steps are used, when carrying out a first embodiment of the method of the present invention. In this first embodiment, the process of the present invention is used to form a shallow trench isolation region between the active regions of the substrate, where devices will be formed. Such a shallow trench isolation region serves to separate one or more devices to be formed on a first active region of the substrate from one or more devices to be formed on a second active region of the substrate.

Figure 1A:
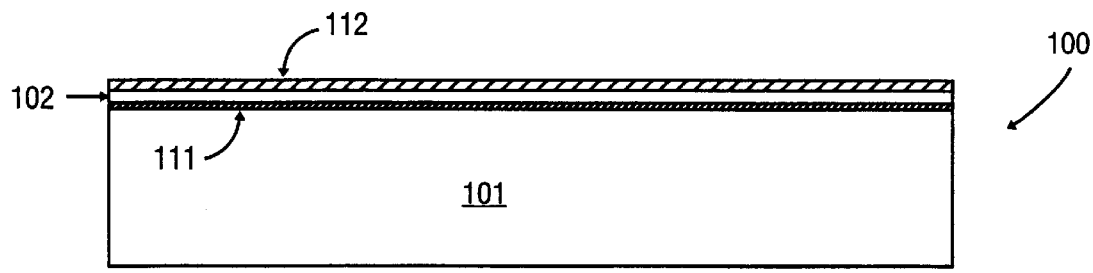
FIGS. 1a–1e represent cross-sections of structures that may result after certain steps are used, when carrying out a first embodiment of the method of the present invention.

FIG. 1a illustrates structure 100, which includes substrate 101 upon which are formed silicon dioxide layer 111, carbon doped oxide ("CDO") containing layer 102, and silicon nitride layer 112. Substrate 101 may comprise a silicon wafer, which has a relatively thin lightly doped epitaxial silicon layer formed on a heavily doped bulk silicon base. Alternatively, substrate 101 may comprise a wafer that includes other materials, for example, silicon and germanium, gallium arsenide, or indium phosphide.

When substrate 101 comprises a silicon wafer, silicon dioxide layer 111, CDO containing layer 102, and silicon nitride layer 112 may be formed on substrate 101 in the conventional manner. Silicon dioxide layer 111 may, for example, be formed on substrate 101 by placing substrate 101 in a vertical diffusion furnace, then feeding oxygen into the furnace while operating it at about 800° C. Silicon dioxide layer 111 preferably should be no greater than about 100 angstroms thick.

CDO containing layer 102 preferably consists essentially of a carbon doped oxide that includes between about 5 and about 50 atom % carbon. Such a CDO may be deposited onto silicon dioxide layer 111 (which may be considered part of the "substrate" upon which the CDO containing layer is formed) using conventional deposition techniques, e.g., a plasma enhanced chemical vapor deposition ("PECVD") process. When using a PECVD process to form layer 102, gases that provide a source of silicon, oxygen, and carbon are fed into a PECVD reactor, which may then be operated at conventional temperatures, pressures, RF and power.

CDO containing layer 102 should be thick enough to serve as a polish stop layer, when a CMP process is applied to a subsequently deposited dielectric layer. To perform that function, CDO containing layer 102 preferably should be between about 200 and about 2,000 angstroms thick, when formed on layer 111. For certain processes, it may be desirable to form a CDO containing layer that is between about 200 and about 1,000 angstroms thick, and even more desirable to form such a layer that is less than about 500 angstroms thick.

Silicon nitride layer 112 may be formed on CDO containing layer 102 using a conventional PECVD or furnace diffusion process. When a PECVD process is used, silicon nitride layer 112 may be formed on layer 102 in situ, i.e., by using the same reactor chamber that was used to form layer 102. When forming layer 112 in that same chamber, the gases used to form CDO containing layer 102 should be purged, followed by feeding a gas stream into the chamber, which includes silane or dichlorosilane, ammonia, and nitrogen. The reactor can then be run at conventional operating conditions to form silicon nitride layer 112 on layer 102. Alternatively, the wafer can be moved to a different chamber prior to using a PECVD process to form layer 112 on layer 102.

When furnace diffusion is used to form silicon nitride layer 112, the wafer may be placed in a diffusion furnace, then subjected to a low pressure chemical vapor deposition process, e.g., a process that exposes the wafer to a gas stream that contains dichlorosilane and ammonia at about 800° C. Silicon nitride layer 112 preferably should be less than about 100 angstroms thick. Even such a thin layer may serve as a barrier layer that protects CDO containing layer 102 during subsequent oxidation steps, or photoresist ashing steps that use an oxygen plasma to remove the photoresist. Forming such a silicon nitride barrier layer on CDO containing layer 102 can reduce carbon depletion that might otherwise occur when layer 102 is exposed to oxygen or an oxygen plasma.

Another benefit to forming a thin silicon nitride layer on CDO containing layer 102, emanates from its giving the resulting structure a silicon nitride surface. By giving that structure such a surface, it may be possible for the process steps, which are applied after forming silicon nitride layer 112, to be similar to those used in current processes, which use silicon nitride as the polish stop layer. Thus, forming silicon nitride layer 112 on CDO containing layer 102 should make it easier to integrate layer 102 into the overall process.

For various reasons, it may be desirable to form silicon nitride layer 112 on CDO containing layer 102, and to form silicon dioxide layer 111 on substrate 101, when making a semiconductor device using the method of the present invention. Nevertheless, a process that does not form either layer 111 or layer 112 (or both) still falls within the spirit and scope of the present invention, as long as it employs a CDO containing layer to control a CMP process used to remove part of a dielectric layer.

After silicon nitride layer 112 is formed on CDO containing layer 102, a trench will be etched through layers 112, 102 and 111, and into substrate 101. Conventional photolithography and etching processes may be used to pattern, and then etch, portions of those layers, and a portion of substrate 101, to generate the trench. Layers 112, 102, and 111, as well as substrate 101, may be etched in situ, i.e., with the wafer remaining in the same chamber of a plasma etcher as plasmas derived from different gas streams are used to etch the different materials. For many applications, the trench preferably is less than about 500 nanometers deep when formed. The optimum depth for the trench will depend, however, upon the particular application for which the process of the present invention is applied.

Figure 1B:
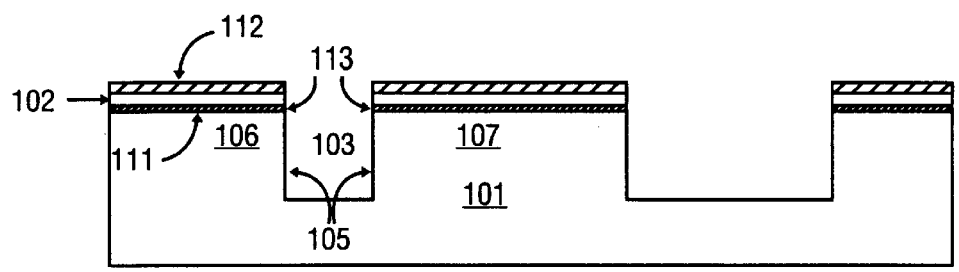

After the trench is formed, the photoresist is removed, e.g., by using a conventional ashing process, to generate the structure illustrated in FIG. 1b. Trench 103 is then cleaned to remove any polymer that may have formed on sidewalls 105 of trench 103, and any residues that remain after the ashing step. In the resulting structure, silicon dioxide layer 111, CDO containing layer 102, and silicon nitride layer 112 cover first and second active regions 106, 107 of substrate 101. In this embodiment, active devices—e.g., transistors—will be built on active regions 106, 107.

After photoresist residue is removed, another sequence of cleaning steps may follow. That sequence may include a hydrofluoric acid ("HF") dip, which cleans sidewalls 105 of trench 103 and removes a small amount of silicon dioxide layer 111 where that layer is exposed. Removing a small amount of that layer enables a subsequent oxidation step to create rounded edges at the trench periphery. Forming such rounded edges may enhance device performance. After the HF dip, an additional cleaning step (or steps) may be applied to remove particles and organic and metallic contaminants from the wafer.

Figure 1C:
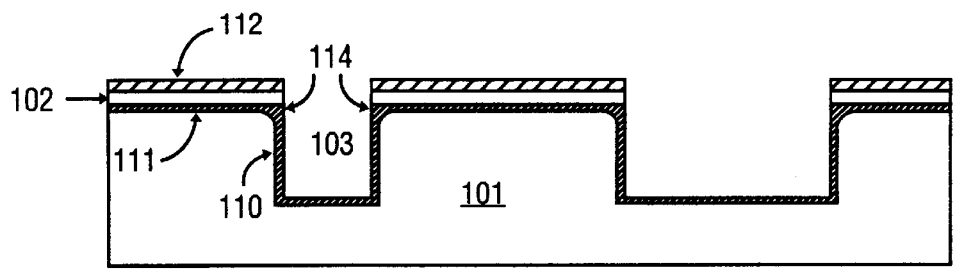
Figure 1D:
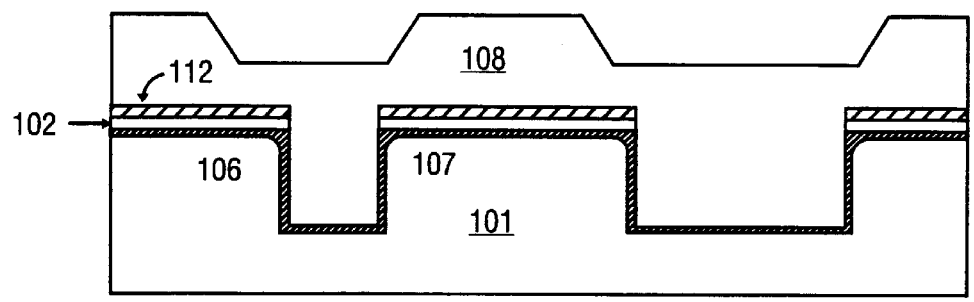

After that cleaning sequence, the resulting structure may be placed in a furnace then exposed to oxygen at about 1000° C. When substrate 101 comprises silicon, this will cause its exposed portions (i.e., sidewalls 105 and corners 113 of trench 103) to oxidize—generating rounded trench corners 114 and lining trench 103 with silicon dioxide insulating layer 110. FIG. 1c represents the structure that such an oxidation step produces. In this embodiment of the present invention, silicon nitride layer 112 protects CDO containing layer 102 from exposure to oxygen during that oxidation step.

After the oxidation step, dielectric layer 108 is deposited to fill trench 103. When deposited to fill the trench, dielectric layer 108 also covers silicon nitride layer 112, producing the FIG. 1d structure. Dielectric layer 108 preferably comprises silicon dioxide, but may include other materials, e.g., undoped polysilicon. When layer 108 comprises silicon dioxide, a conventional high density plasma ("HDP") process (e.g., one that employs a gas stream that includes silane, oxygen and an inert gas such as argon) may be used to form that layer. (Although silane is a preferred source of silicon for such a process, other materials may be used instead, e.g., tetraethoxysilane or tetraethylorthosilicate ("TEOS")). Such a process simultaneously deposits and etches the oxide, enabling trench 103 to be filled from the bottom up. As will be apparent to those skilled in the art, a typical HDP process preferably takes place at a very low pressure (e.g., a vacuum) and with a relatively high density of ions, when compared to other conventional PECVD processes.

Although dielectric layer 108 preferably is deposited onto layer 112 using a HDP process, other PECVD processes may be used to form that layer. One such process, in which a first dielectric layer is deposited, then etched, followed by depositing a second dielectric layer, is described in U.S. Pat. No. 5,719,085—assigned to this application's assignee. By replacing a relatively thick silicon nitride polish stop layer with a relatively thin CDO polish stop layer, the method of the present invention renders feasible the use of other PECVD processes to form layer 108 as the thinner polish stop layer decreases the trench's aspect ratio, making it easier to fill.

After dielectric layer 108 is formed on silicon nitride layer 112, the portions of layer 108, which are located on first and second active regions 106, 107, must be removed. A conventional CMP process may be used to remove layer 108 from those regions to generate the FIG. 1e structure. When such a process is applied, CDO containing layer 102 may serve as a polish stop layer. Such a polish stop layer serves to minimize the amount of layer 108 that is removed from trench 103, and further ensures that the CMP process does not remove portions of the substrate that comprise active regions 106, 107.

In a preferred embodiment, the CMP process removes dielectric layer 108 at a rate that is at least about 5 times as fast as the rate at which it can remove the CDO containing layer. Even more desirable is a process that removes dielectric layer 108 at a rate that is at least about 10 times as fast as the rate at which it can remove the CDO containing layer. To facilitate such a relatively high selectivity for dielectric layer 108 over CDO containing layer 102, the CMP process may use a slurry that comprises an abrasive and an alkaline based material. The abrasive may include a silica based material, e.g., silicon dioxide, and the alkaline based material may include a hydroxide based material, e.g., ammonium hydroxide or potassium hydroxide. Particularly preferred is a slurry that consists of fumed silica suspended in a potassium hydroxide solution.

For processes in which polish selectivity to layer 108 over layer 102 is relatively low, it may be desirable to make layer 102 thicker. Conversely, when the polish selectivity to layer 108 over layer 102 is relatively high, it may be desirable to make layer 102 thinner. In the embodiment described here, the CMP step removes silicon nitride layer 112 when removing dielectric layer 108. In other embodiments, some of layer 112 may remain on layer 102 even after that process step.

Figure 1E:
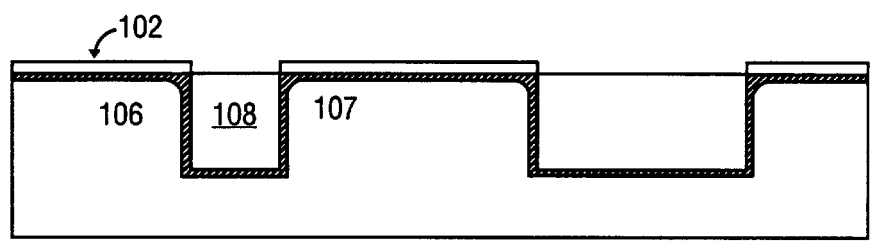

After the structure shown in FIG. 1e is formed, CDO containing layer 102 and silicon dioxide layer 111 must be removed from the surface of active regions 106 and 107 to enable devices to be formed on those surfaces. (If any portion of silicon nitride layer 112 remains on top of layer 102, that remaining portion of that layer must also be removed.) Because those layers may be removed from substrate 101 using conventional techniques that are well known to those skilled in the art, they will not be described in more detail here.

By using a CDO containing layer, instead of silicon nitride, to form the polish stop layer, the method of the present invention provides for increased polish selectivity for the dielectric layer over the polish stop layer. This reduces the risk that the CMP step will break through the polish stop layer to the underlying substrate. In addition, this property enables a thinner polish stop layer to be used, which may help increase wafer throughput and provide greater flexibility when considering options for filling the trench with a dielectric layer.

Figure 2A:
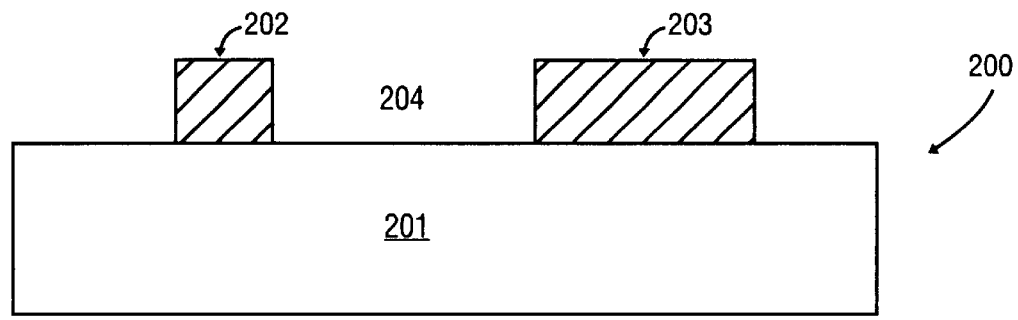
FIGS. 2a–2d represent cross-sections of structures that may result after certain steps are used, when carrying out a second embodiment of the method of the present invention.

FIGS. 2a–2d represent cross-sections of structures that may result after certain steps are used, when carrying out a second embodiment of the method of the present invention. FIG. 2a illustrates structure 200, which includes substrate 201 upon which are formed raised members 202 and 203. Substrate 201 may be any surface upon which various devices may be formed. Substrate 201 may comprise, for example, a silicon wafer, which has a relatively thin lightly doped epitaxial silicon layer formed on a heavily doped bulk silicon base. Substrate 201 may further include active and passive devices that are formed on such a silicon wafer, e.g., transistors, capacitors, resistors, diffused junctions, gate electrodes, local interconnects, etc. . . . Substrate 201 may also include insulating materials (e.g., silicon dioxide, either undoped or doped with phosphorus (PSG) or boron and phosphorus (BPSG); silicon nitride; silicon oxynitride; silicon carbide; carbon doped oxide; an organic containing silicon oxide; or a polymer) that separate such active and passive devices from conductive layers that are formed on top of them, and may include various types of conductive layers.

Figure 2B:
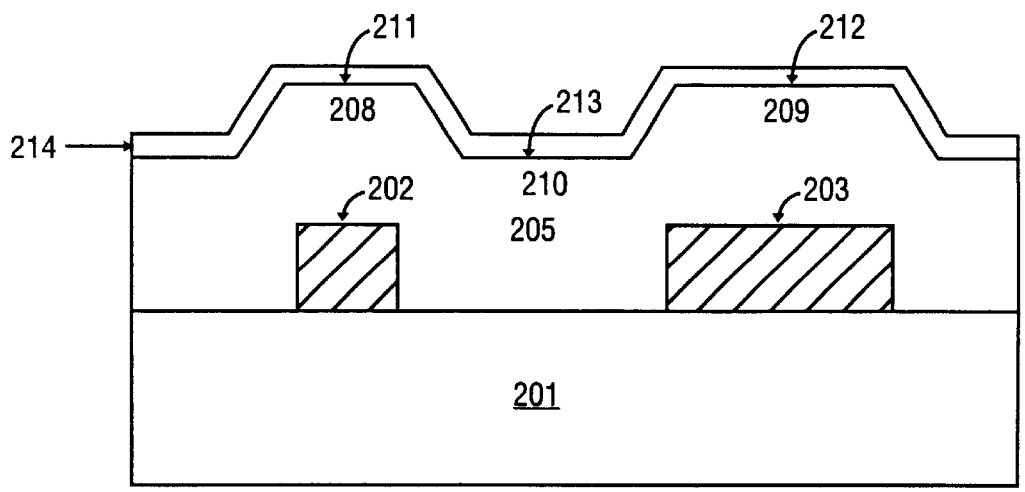

Raised members 202, 203 may be any of a variety of structures that may be formed on a semiconductor device's substrate, e.g., various types of dielectric or conductive elements or regions. Raised member 202 is separated from raised member 203 by trench 204. For various reasons, trench 204 may be subsequently filled with dielectric layer 205, as shown in FIG. 2b. When filling trench 204, dielectric layer 205 will cover first and second raised members 202 and 203. As deposited, dielectric layer 205 includes elevated sections 208, 209 and recessed section 210. Elevated sections 208, 209 have elevated surfaces 211, 212, and recessed section 210 has recessed surface 213.

Dielectric layer 205 preferably comprises silicon dioxide or silicon oxyfluoride, but may include (or be made from) other materials. Layer 205 may be formed using a conventional chemical vapor deposition process, e.g., a conventional PECVD process. After dielectric layer 205 is deposited, relatively thin CDO containing layer 214 is formed on its surface, as shown in FIG. 2b. Layer 214 preferably consists essentially of a carbon doped oxide that includes between about 5 and about 50 atom % carbon, and may be formed using conventional PECVD techniques. Layer 214 may be deposited on layer 205 in situ, i.e., without having to remove the wafer from the chamber that was used to deposit layer 205.

In the resulting structure, CDO containing layer 214 covers elevated surfaces 211, 212 and recessed surface 213 of dielectric layer 205. CDO containing layer 214 should be thick enough to ensure that a subsequent CMP polishing process can generate a more planar surface for dielectric layer 205 than could be generated in the absence of layer 214. To perform that function, CDO containing layer 214 preferably is between about 100 and about 2,000 angstroms thick, when formed on dielectric layer 205. The optimum thickness for layer 214 will depend upon the particular application for which the described method is applied.

After CDO containing layer 214 is formed on dielectric layer 205, the portions of layer 205 that lie above first and second raised members 202, 203 are removed. A conventional CMP process may be used to perform that function. When such a process is applied, it initially removes CDO containing layer 214, where formed on elevated surfaces 211, 212 of dielectric layer 205, to generate the FIG. 2c structure. Because the polishing pad will conform to the topography of the surface to be polished, the polishing action will simultaneously remove layer 214 from the side and from the top of elevated sections 208, 209 causing tapered extensions 206 to form.

Next, elevated sections 208, 209 of dielectric layer 205 are removed, followed by removing CDO containing layer 214, where formed on recessed surface 213 of dielectric layer 205. After the remainder of layer 214 is removed from the surface of dielectric layer 205, the CMP process removes recessed section 210 from dielectric layer 205 to produce the FIG. 2d structure.

Figure 2C:
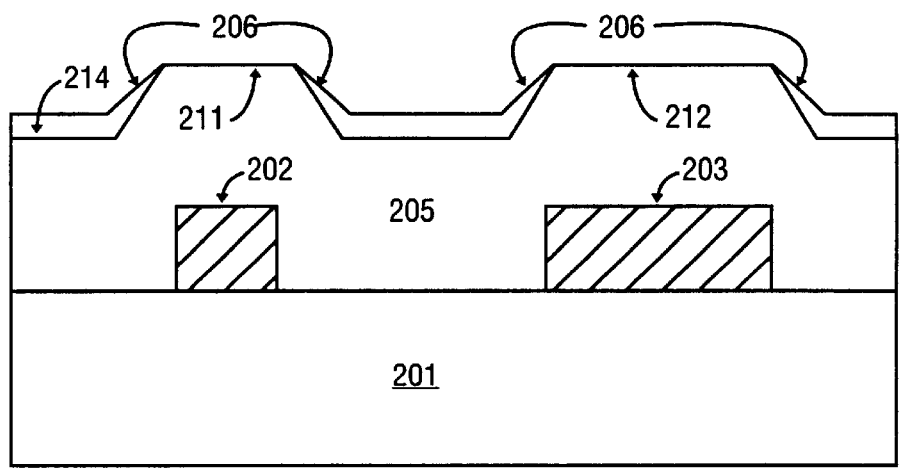
Figure 2D:
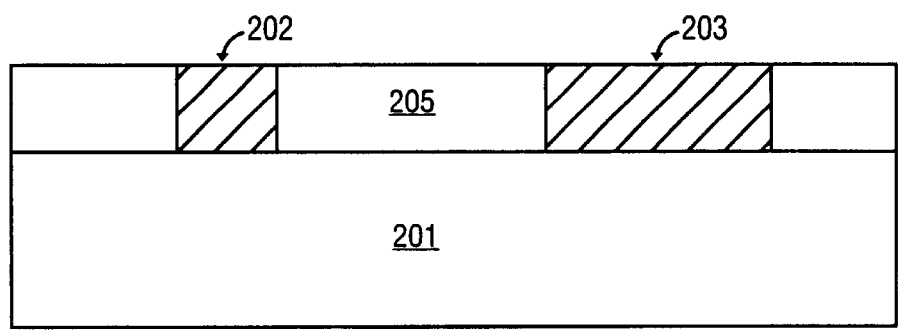

As FIGS. 2b–2d illustrate, in this embodiment, the CMP process removes dielectric layer 205 from the surfaces of raised members 202, 203 to generate a substantially planar surface for the portion of dielectric layer 205 that remains inside trench 204. As shown in FIG. 2d, that substantially planar surface is substantially flush with the surfaces of raised members 202, 203. Although this embodiment polishes dielectric layer 205 down to the surfaces of raised members 202, 203, alternative embodiments may generate a substantially planar surface for layer 205 that is located above those raised members. Such a planar surface may lie at the level of the lower sections of layer 214, with those sections of layer 214 performing a polish stop function, or lie below that level, e.g., when removing all of layer 214 before generating a planar surface that is located above the raised members.

In a preferred embodiment, the CMP process used to remove CDO containing layer 214 and part of dielectric layer 205 removes dielectric layer 205 at a rate that is at least about 5 times, and more preferably at least about 10 times, as fast as the rate at which it removes the CDO containing layer. To facilitate such a relatively high selectivity for dielectric layer 205 over CDO containing layer 214, the CMP process may use a slurry that comprises an abrasive and an alkaline based material, e.g., a slurry that consists of fumed silica suspended in a potassium hydroxide solution. Layers 214 and 205 may be removed using a single continuous CMP process, or alternatively, by modifying the CMP process as the polishing process works its way down through those layers.

By forming a CDO containing layer on top of a dielectric layer, this embodiment of the present invention enables a CMP process to planarize a dielectric layer, which has an uneven topography when initially formed. This result may be achieved because the CDO and dielectric layers polish at different rates. Because the CMP process removes the carbon doped oxide at a much slower rate than it removes the dielectric layer, elevated sections 208, 209 of dielectric layer 205 may be removed, while recessed section 210 remains protected by CDO containing layer 214. Removing elevated sections 208, 209, while retaining recessed section 210, may produce a structure that has a substantially planar surface. The remainder of layer 214, and recessed section 210, can then be removed, if desired, to generate the FIG. 2d structure.

Features shown in the above referenced drawings are not intended to be drawn to scale, nor are they intended to be shown in precise positional relationship. Additional process steps that may be used to make the embodiments described above have been omitted when not useful to describe aspects of the present invention.

Although the foregoing description has specified a method for forming a semiconductor device that uses certain materials and process steps, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for forming a semiconductor device comprising:
    forming within a substrate a shallow trench isolation region, which will separate a first device to be formed on a first active region of the substrate from a second device to be formed on a second active region of the substrate, by:
        forming on the substrate a carbon doped oxide containing layer that is between about 100 and about 2,000 angstroms thick;
        forming a silicon nitride layer on the carbon doped oxide containing layer after forming the carbon doped oxide containing layer on the substrate;
        removing a portion of the carbon doped oxide containing layer and a portion of the underlying substrate to form a trench within the substrate, the carbon doped oxide containing layer remaining on the first and second active regions of the substrate;
        lining the trench with a silicon dioxide layer;
        filling the trench with a dielectric layer that comprises silicon dioxide, the dielectric layer covering the carbon doped oxide containing layer where that layer covers the first and second active regions of the substrate; and
        applying a chemical mechanical polishing process to remove the dielectric layer from the surface of the carbon doped oxide containing layer at a rate that is at least about 5 times as fast as the rate at which it can remove the carbon doped oxide containing layer.

2. The method of claim 1 wherein the silicon nitride layer is less than about 100 angstroms thick, when formed on the carbon doped oxide containing layer.

* * * * *